United States Patent [19]

Osawa

[11] Patent Number: 4,528,520

[45] Date of Patent: Jul. 9, 1985

[54] WIDE BAND HIGH OUTPUT AMPLIFIER USING A POWER FIELD EFFECT TRANSISTOR AS AN OUTPUT STAGE

[75] Inventor: Michitaka Osawa, Yokohama, Japan

[73] Assignee: Hitachi, Ltd., Tokyo, Japan

[21] Appl. No.: 495,495

[22] Filed: May 17, 1983

[30] Foreign Application Priority Data

May 21, 1982 [JP] Japan .................................. 84706

[51] Int. Cl.³ ........................ H03F 3/16; H03F 3/193
[52] U.S. Cl. .................................... 330/300; 330/306
[58] Field of Search ............... 330/175, 277, 300, 302; 315/403, 405

[56] References Cited

U.S. PATENT DOCUMENTS 4,053,841  10/1977  Rosen et al. ................. 330/277 X
4,432,967  8/1982   Regan et al. ................. 330/311 X
4,464,636  8/1984   Dobrovolny ................... 330/300

Primary Examiner—James B. Mullins
Assistant Examiner—Steven J. Mottola
Attorney, Agent, or Firm—Antonelli, Terry & Wands

[57] ABSTRACT

Disclosed is a wide band high output amplifier in which a field effect transistor is used as an output element, in which a constant resistance circuit is inserted between the drain terminal of the field effect transistor and a load capacitance such that the impedance characteristic is a constant resistive value and provides a peaking function across the load capacitance so as to improve the high frequency characteristic of the amplifier without increasing the imput impedance of the field effect transistor.

6 Claims, 11 Drawing Figures

WIDE BAND HIGH OUTPUT AMPLIFIER USING A POWER FIELD EFFECT TRANSISTOR AS AN OUTPUT STAGE

BACKGROUND OF THE INVENTION

1. Field of the Invention

The present invention relates to an amplifier suitable for a wide band high output circuit such as a driving circuit for, for example, a cathode ray tube display.

2. Description of the Prior Art

Conventionally, a wide band high output video amplifier for driving a cathode ray tube (hereinafter abbreviated as CRT) comprises a bipolar transistor which operates as a driving element and a peaking circuit which compensates for deterioration in the high frequency characteristic in the amplifier due to an input capacitance of the CRT by using an inductance element. FIG. 1 illustrates an example of such a conventional amplifier which will be first described by referring to the drawings. Generally, for a driving circuit in a wide band amplifier, a cascode circuit constituted by a common-emitter stage and a common-base stage (common-gate stage if a field effect transistor (hereinafter abbreviated as FET) is used) is employed.

In FIG. 1, the reference numeral 1 denotes a CRT, 2 denotes a load resistor, 3 denotes a peaking coil, 4 denotes a load capacitor, 5 denotes an output bipolar transistor, 6 denotes a driving bipolar transistor, 7 denotes an emitter resistor, 8 denotes an input signal source, and 9 denotes a bias voltage. In FIG. 1, those elements other than the peaking coil 3 constitute a basic circuit of a cascode video amplifier. Assuming that each of the output and driving bipolar transistors 5 and 6 is sufficiently good in high frequency characteristic, the cut-off frequency of this video amplifier is determined by the factor, that is the time constant (one stage low-pass filter) constituted by the resistance $R_L$ of the load resistor 2 and the capacitance $C_L$ of the load capacitor 4. The capacitance $C_L$ of the load capacitor is the sum of the output capacitance of the transistors 5 and 6, the input capacitance of the CRT 1, and the stray capacitance of wiring and the like, and becomes a main load for the frequency characteristic of the video amplifier in the high frequency range.

The output circuit including the peaking coil 3 as shown in FIG. 1 is called a shunt peaking circuit, in which the load capacitance $C_L$ and the inductance $L_P$ of the peaking coil 3 constitute a parallel resonance circuit to increase the amplification at the upper end of the frequency band so as to expand the band width in the vicinity of the cut-off frequency of the video amplifier by properly adjusting the resonance frequency $f_o$ and the quality factor Q. The frequency characteristic of the load impedance $Z_L$ when the output side is viewed from the output transistor 5 of the shunt peaking circuit illustrated in FIG. 1 may be as shown in FIG. 2. The particular relations among the resonance frequency $f_o$, the quality factor Q, and the load impedance $Z_L$, etc. are not described here because they are well known by the teachings of various references.

The bipolar transistors used as amplifying elements in FIG. 1 will be now described. In the case of a cascode amplifier, since the transistor 6 used as an element in the driving stage not only converts a voltage input into a current so as to produce a current output but also operates as a common-emitter (or commonsource) element, it is particularly important that the transistor 6 has a good high-frequency-characteristic and a large mutual conductance gm. Since the maximum voltage applied to the driving transistor 5 is made to be the bias voltage, the driving transistor 6 may be selected to have relatively low breakdown voltage. That is, generally, a high frequency transistor of low breakdown voltage can be used for the element in the driving stage. This is helpful in view of the technique for producing high frequency bipolar transistors so that the element in the driving stage is easily available and there is a large degree of freedom for selecting the element. The transistor in the output stage is, on the other hand, used with the common-base (or common-gate) and, therefore, it may be used to the utmost limit of the capability in its high frequency characteristic. Since the transistor in the output stage is, however, required to satisfy various contradictory requests such as a large allowable collector power dissipation with high breakdown voltage, a small output capacitance, a good high frequency characteristic, or the like, it has a difficult or serious problem in selection and design thereof. Particularly, in recent experiments, an important problem has appeared that the collector volume resistance increases to cause a false saturation phenomenon due to a so-called emitter fringing effect, that is the emitter region becomes substantially narrow under the condition of a high frequency large current in spite of the fact that the element has a cut-off frequency to make it possible to sufficiently cover the used band. The false saturation phenomenon causes the collector volume resistance to increase to thereby reduce the effective output current to restrict the possible maximum power output. This leads not only to the necessity of increasing the source voltage to thereby cause an increase in power dissipation in the collector and in power consumption in the circuit but also the need for an element having higher breakdown voltage, resulting in a problem that the compatibility with the high frequency characteristic becomes more difficult.

Thus, it has been found that there is a serious problem to be solved in the case where a bipolar transistor is used in the output stage. On the other hand, it has become apparent that the power MOS FET which has been recently initiated for use in audio instruments or switching regulators has very superior performance also in use for video output. Particularly, for the output element in the cascode amplifier in FIG. 1, the power MOS FET has very superior merits as follows:

(1) It is easy to make the breakdown voltage high without deteriorating the high frequency characteristic to such an extent;

(2) The area of safe operation (ASO) is wide; and (3) No false saturation phenomenon occurs, etc. The power MOS FET has, on the other hand, a very serious structural defect in the high frequency range in that the drain zone and the source zone are connected to each other through capacitance. The difference in structure between the FET and the bipolar transistor will be briefly described by referring to FIGS. 3 and 4.

Although the description will be made with the most popular power MOS FET as a model of FET in this application, the discussion of course applies to the static induction transistor, or the like.

FIGS. 3A and 3B illustrate the general structure of a bipolar transistor and an equivalent circuit thereof when the bipolar transistor is used with the common-base. In FIGS. 3A and 3B, various reference characters are used to denote various parameters as follows:

E: an emitter, B: a base, C: a collector, $C_{be}$: base-emitter capacitance, $r_{be}$: base-emitter resistance, $v_{be}$: base-emitter voltage, gm: mutual conductance, $C_{ob}$: output capacitance of collector. Although further parameters are required to describe in detail, the characteristics of a bipolar transistor in video frequency band may be approximated by those parameters used in FIGS. 3A and 3B. The most important characteristic of the bipolar transistor as shown in FIG. 3 is that the mutual conductance gm is large and the collector-emitter capacitance is negligible small.

Next, the power MOS FET as shown in FIGS. 4A and 4B will be described. In FIGS. 4A and 4B, the same reference characters as those already used in FIGS. 3A and 3B denote the same parameters and other reference characters are used to denote the parameters as follows:

S: a source, G: a gate, D: a drain, $C_{gs}$: gate-source capacitance, $C_{sd}$: source-drain capacitance, $C_{dg}$: drain-gate capacitance, $v_{gs}$: gate-source voltage.

As will be apparent from FIGS. 3A, 3B, 4A and 4B, in the case of the bipolar transistor only the current source gm·$v_{be}$ is inserted between the collector and emitter, while in the case of the power MOS FET the source-drain capacitance $C_{sd}$ is additionally inserted in parallel with the current source gm·$v_{gs}$ between the drain and source so that it may be considered that the source and the drain are completely connected through the sourcedrain capacitance $C_{sd}$ in the sense of high frequency, resulting in a very important defect of the MOS FET as will be described later.

Next, discussion will be made as to the input impedance characteristic of each of a bipolar transistor and a MOS FET, in the cases of the common-base and common-gate. The relation between the absolute value of the input impedance and the frequency of the bipolar transistor and the power MOS FET is as shown by solid line in FIGS. 5 and 6 respectively. In the case of the bipolar transistor of FIG. 5, the absolute value of the input impedance monotonously changes as the frequency changes, while in the case of the power MOS FET in FIG. 6, the absolute value of the input impedance has a peak at a certain frequency (shown by f′ in FIG. 6) mainly due to the relation between the mutual conductance gm and the source-drain capacitance $C_{sd}$. If calculation is made by using the simple equivalent circuit as shown in FIG. 4 (a relatively good approximation can be obtained in the case of a MOS FET having a small gate resistance), the peak of the absolute value $|Z_{in}|$ of the input impedance $Z_{in}$ becomes smaller and the peak frequency moves toward the higher frequency zone as the mutual conductance gm becomes larger under the condition that the source-drain capacitance $C_{sd}$ is fixed. Alternatively, if the source-drain capacitance $C_{sd}$ is caused to increase with the mutual conductance gm fixed, the peak of the absolute value $|Z_{in}|$ increases and the peak frequency moves toward the lower frequency zone. In the case where a power MOS FET is used in a video output stage, it is necessary to make the peak value $|Z_{in}|$ sufficiently small or make the peak frequency sufficiently small or make the peak frequency sufficiently high and to select one having a substantially flat characteristic over the used frequency band.

Next, the characteristic shown by dotted line in FIGS. 5 and 6 will be described. The input impedance characteristic in the cases of the common-base and the common-gate are shown by dotted line in FIGS. 5 and 6 respectively when an impedance element having an impedance value which has a peak at a certain frequency. In the case of a power MOS FET as shown in FIG. 6, the effect of the drain side is apparent in that the peak value of $|Z_{in}|$ becomes maximum when $f_o$ coincides with f′. This arises a very serious problem when a power MOS FET is used as an output transistor in such a cascode amplifier as shown in FIG. 1. That is, in the common-gate element which has its remarkable characteristic in its low input impedance, if the input impedance of an output transistor takes a very large value at a certain frequency, a large voltage amplitude is produced at the collector of the driving bipolar transistor in FIG. 1 and the frequency characteristic is deteriorated due to Miller effect at the base side of the driving bipolar transistor. Further, the bias voltage $E_B$ is generally selected to be about 10 volts in the viewpoint of the collector power dissipation and the breakdown voltage in the driving transistor and there is much possibility to cause the worst situation in which the output waveform is clipped due to shortage of the dynamic range of the driving bipolar transistor in case where a large voltage amplitude is produced at the collector of the driving bipolar transistor.

As described above, a power MOS FET having a remarkable merit in comparison with a bipolar transistor when used as an output element in a wide high output amplifier, has also a serious defect so that it is necessary to pay sufficient attention in using the power MOS FET and the scope of application of the power MOS FET is very narrow.

SUMMARY OF THE INVENTION

It is an object of the present invention to eliminate the defects in the prior art and to provide a wide band and high output amplifier employing a power MOS FET which has a superior characteristic in comparison with a bipolar transistor.

To attain the above-mentioned object, according to the present invention, a constant resistance network is inserted between the drain terminal of the power MOS FET and a load capacitance, the network having a constant resistive impedance characteristic and including an inductance element for providing a peaking function. This network is obtained by equivalently converting a lattice network, the circuit constants of which are determined such that the constant resistive characteristic is established, into a bridged-T network which is an unbalanced network. Since the impedance characteristic viewed from the drain terminal of the power MOS FET is made to have a constant resistive characteristic as described above, the defect in the prior art in that the input impedance of the power MOS FET is increased due to a peaking element, that is inductance, may be prevented from occurring and the high frequency characteristic may be improved by the peaking function.

DESCRIPTION OF THE PREFERRED EMBODIMENTS

Figure 9:
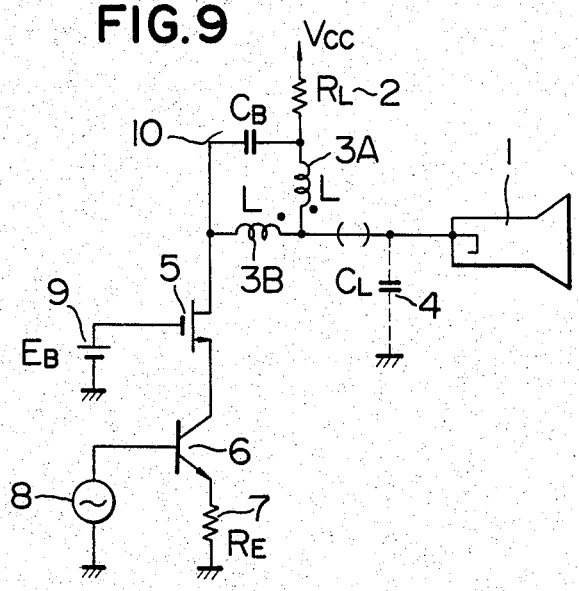
FIG. 9 is a circuit diagram illustrating the wide band high output amplifier according to an embodiment of the present invention.

FIG. 9 shows the wide band high output amplifier according to a preferred embodiment of the present invention, in which a power MOS FET having a characteristic superior to a bipolar transistor is employed as an output element in a video output stage of the amplifier, in which a network functioning as a peaking circuit for improving the high frequency characteristic of the amplifier is composed of inductance elements 3A and 3B, a capacitor 10 and a load resistor 2 so as obtain a peaking function at a capacitive load 4 connected to an output terminal, the values of the elements being selected so that the impedance characteristic at the output side of the network has a constant resistive characteristic when viewed from the drain terminal of the FET 5 and equal to the resistance $R_L$ of the load resistor. Accordingly, even in the case where a power MOS FET is used in the video output stage and a peaking function is provided therein, the input impedance is not increased. On the contrary, the input impedance remains stable to thereby make it possible to improve the high frequency characteristic of the video amplifier.

Figure 7:
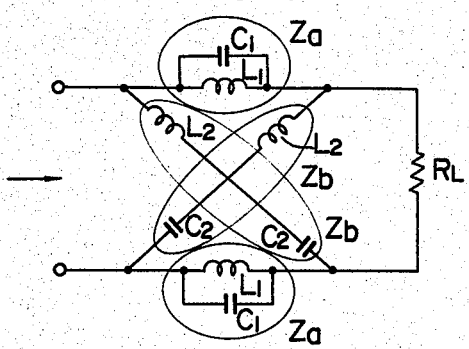
FIG. 7 is a circuit diagram illustrating a lattice network.
Figure 8:
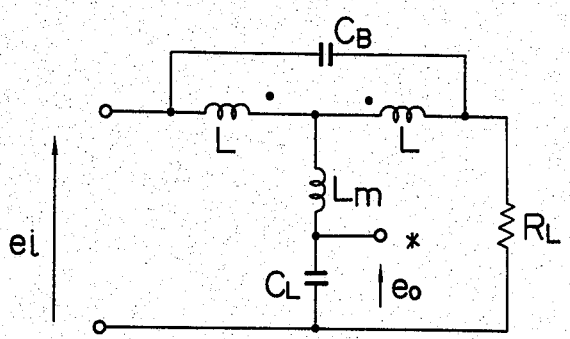
FIG. 8 is a circuit diagram illustrating a bridged-T network converted from the lattice network of FIG. 7.

The embodiment of the present invention will be further described in more detail by referring to FIGS. 7 to 9. FIG. 7 shows a so-called a lattice network. In the lattice network, if the respective values of the inductance $L_1$, $L_2$ capacitance $C_1$, $C_2$ are properly selected such that the impedance $Z_a$ constituted by the inductance $L_1$ and the capacitance $C_1$ and the impedance $Z_b$ constituted by the inductance $L_2$ and the capacitance $C_2$ always satisfy the following equation (1).

$$Z_a \cdot Z_b = R_L^2 \tag{1}$$

the impedance viewed from the direction indicated by an arrow in FIG. 7 is constant independent of the frequency and is a pure resistive value $R_L$, as is well known. If the lattice network is equivalently converted into the bridged-T network of FIG. 8 and if the constants of the inductance $L$, $L_m$ and the bridge capacitance $C_B$ are suitably selected such that the peaking is effected with the voltage at the point indicated by the mark *, a video output network in which the load is a constant pure resistance $R_L$ when viewed from the driving source and peaking is effected across the capacitive load $C_L$. The conversion from the lattice network into the bridged-T network while maintaining the condition of equation (1) is expressed by the following equations:

$$C_B = \tfrac{1}{4}C_1 \tag{2}$$

$$L = L_1 \tag{3}$$

$$L_m = (L_2 - L_1)/2 \tag{4}$$

$$C_L = 2C_2 \tag{5}$$

From the condition (1) for the constant resistance of the lattice network, the following relations can be obtained:

$$L_1 = R_L^2 C_2 \tag{6}$$

$$L_2 = R_L^2 C_1 \tag{7}$$

Applying the equations (6) and (7) to the equations (2)~(5).

$$L_1 = \tfrac{1}{2} R_L^2 C_L = L \tag{8}$$

$$L_2 = 2R_L^2 C_B \tag{9}$$

$$L_m = (L_2 - L_1)/2 = R_L^2(C_B - \tfrac{1}{4}C_L) \tag{10}$$

Let $$C_B = nC_L (\text{n being a constant}) \tag{11}$$

Then, $$L_m = R_L^2 C_L (n - 0.25) \tag{12}$$

Thus, the constants of FIG. 8 are expressed by the three equations (8), (11) and (12). Generally, the mutual inductance $L_m$ of FIG. 8 is constituted by two coupled inductances $L$. Alternatively, one inductance element can be made to operate equivalently as two inductance elements by providing a center tap in the one inductance element and at the same time the mutual inductance $L_m$ can be equivalently incorporated into the one inductance element by adjusting the magnetical coupling. In order to satisfy the condition to effect the peaking function by this constant resistance network, the ratio of the output voltage to the input voltage, that is the transfer function $A_v = e_o/e_i$, is obtained, the value n which causes the transfer function to be constant with respect to the wide frequency range, the thus obtained values are substituted into the equations (8), (11) and (12), to thereby determine the values of the elements of the network so that it will have a constant resistive characteristic and which is provided with the peaking function at the output end of the capacitance $C_L$.

Figure 1:
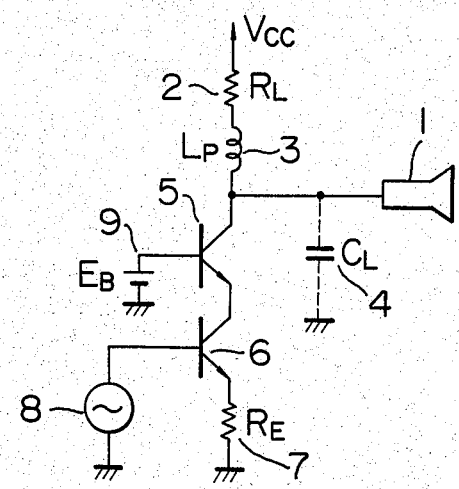
FIG. 1 is a circuit diagram illustrating a conventional wide band high output amplifier.
Figure 2:
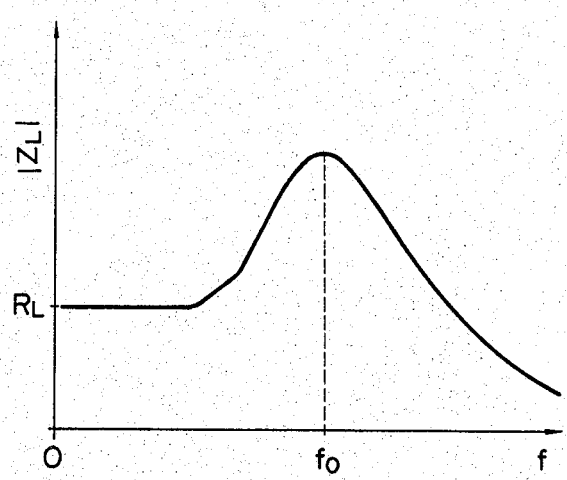
FIG. 2 is a graph illustrating the impedance-frequency characteristic of the shunt peaking circuit.
Figure 3A:
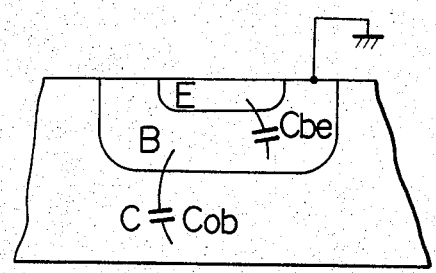
FIGS. 3A and 3B are diagrams illustrating a typical structure of a bipolar transistor and an equivalent circuit diagram of the same, respectively.
Figure 3B:
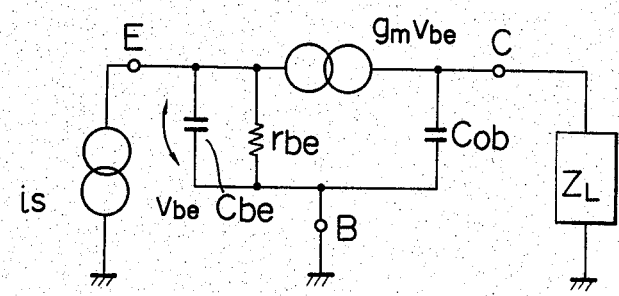
Figure 5:
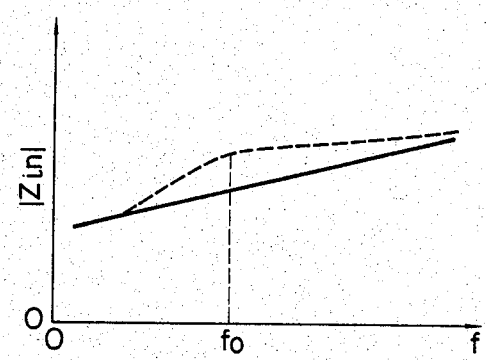
FIG. 5 is a graph illustrating the input-impedance-frequency characteristic of the bipolar transistor with the common-base.
Figure 4A:
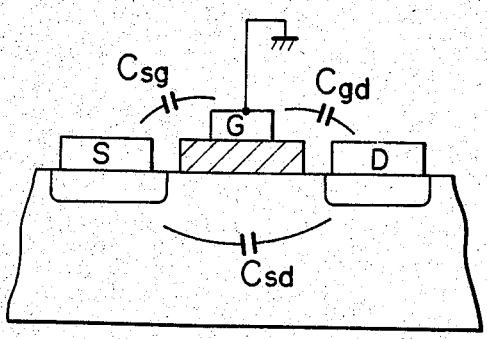
FIGS. 4A and 4B are diagrams illustrating a typical structure of an FET and an equivalent circuit diagram of the same, respectively.
Figure 4B:
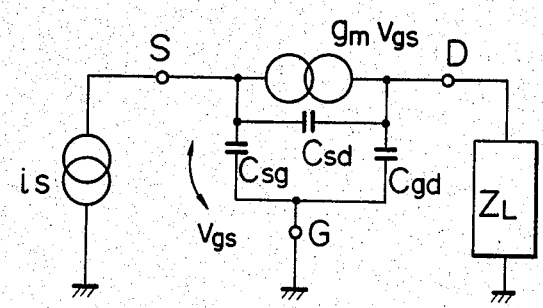

In the embodiment of the invention shown in FIG. 9, the bridged-T peaking network of FIG. 8 is employed in the video output stage and a power MOS FET is used as the output element. In FIG. 9, the same reference numerals as those used in FIGS. 1 and 8 denote the same elements. In FIG. 9, the mutual inductance $L_m$ shown in FIG. 8 is constituted by the magnetic coupling of the peaking coils 3A and 3B and considered to be electrically equivalently provided in the output terminal portion indicated by the mark ( ) in FIG. 9.

Figure 6:
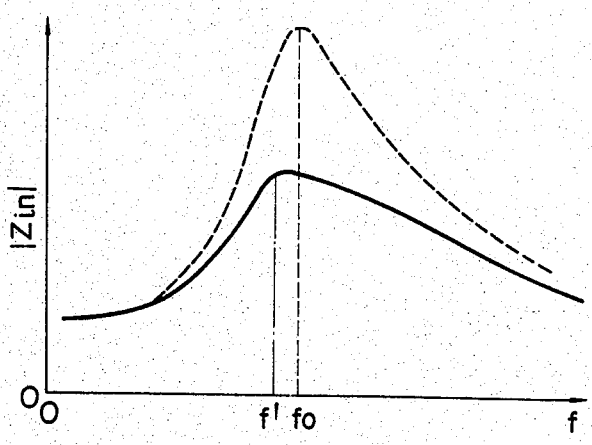
FIG. 6 is a graph illustrating the input-impedance-frequency characteristic of the FET with the common-gate.

As described above, according to the present invention, the load of the output power MOS FET is a peaking circuit showing a constant pure resistive characteristic independent of the frequency and therefore the stability in operation of the FET may be improved and the increase of input impedance, as shown by dotted line in FIG. 6, due to the feedback from the drain terminal to the source terminal can be suppressed substantially to the characteristic shown by solid line. That is, this corresponds to the expansion of the dynamic range of the driving bipolar transistor in FIG. 9 to thereby make it possible to lower the value of the voltage $E_B$ and to reduce the loss of the driving bipolar transistor and on the contrary it is also possible to insert a capacitor in parallel with the gain adjusting resistor $R_E$ to thereby effect sufficient emitter peaking. Further, for output power MOS FET, the peaking circuit is no more than the driving of the pure resistor $R_L$ and negative feedback is effected from the drain terminal to the base of the driving bipolar transistor 6 to thereby further improve the frequency characteristic.

There is a further advantage that the deterioration due to Miller effect in characteristic of the driving transistor can be improved by the suppression of the increase of the input impedance of the output transistor 5 and stabilization of the same input impedance in peaking duration.

As described above, according to the present invention, in a wide band high output video amplifier in which a common-gate power MOS FET is used together with a peaking circuit, since the input impedance can be stabilized and the increase of the input impedance can be suppressed, the further widening of the frequency band of the amplifier can be attained owing to the advantages such as the increase in quantity of the peaking, the suppression of Miller effect, or the like.

I claim:

1. A wide band high output amplifier for amplifying signals within a predetermined wide band of frequencies comprising:

a field effect transistor used in an output stage of said amplifier;

a peaking circuit for increasing amplification at the upper end of a high frequency band of said amplifier within said wide band of frequencies, said peaking circuit including an output terminal for deriving an output from said peaking circuit, and means for minimizing an increase in the input impedance characteristic of said field effect transistor caused by said peaking circuit during operation over said predetermined wide band of frequencies, said means comprising forming said peaking circuit as a constant resistance network in which respective circuit constants are selected such that the impedance at the output side of said network when viewed from a drain terminal of said field effect transistor becomes a constant pure resistive value independent of frequency throughout said predetermined wide band of frequencies when a capacitive load is connected to said output terminal.

2. A wide band high output amplifier according to claim 1, in which said constant resistance network includes a first and a second inductance element connected in series to each other between said drain terminal and one end of a load resistance and magnetically coupled to each other, and a capacitor connected in parallel with the series connection of said first and second inductance elements, the other end of said load resistance being connected to a power source, said output terminal being provided at a junction point between said first and second inductance elements.

3. A wide band high output amplifier for amplifying input driving signals within a predetermined wide band of frequencies to drive a predetermined drive circuit comprising:

a first bipolar transistor coupled to receive said input driving signals at a base thereof, said bipolar transistor having an emitter coupled to a predetermined reference potential;

a first field effect transistor having a source coupled to a collector of said first bipolar transistor and having a gate coupled to receive a bias signal;

a peaking circuit coupled to a drain of said first field effect transistor for increasing amplification at an upper end of a high frequency band of said amplifier within said wide band of frequencies, said peaking circuit including an output terminal coupled to said predetermined driven circuit for deriving an output from said peaking circuit; and means for minimizing an increase in the input impedance characteristic of said field effect transistor caused by said peaking circuit during operation over said predetermined wide band of frequencies, said means comprising forming said peaking circuit as a constant resistance network in which respective circuit constants are selected such that the impedance at the output side of said network when viewed from a drain terminal of said field effect transistor becomes a constant pure resistive value independent of frequency throughout said predeterminal wide band of frequencies when a capacitive load is connected to said output terminal.

4. A wide band high output amplifier according to claim 3, in which said constant resistance network includes a first and a second inductance element connected in series to each other between said drain terminal and one end of a load resistance and magnetically coupled to each other, and a capacitor connected in parallel with the series connection of said first and second inductance elements, the other end of said load resistance being connected to a power source, said output terminal being provided at a junction point between said first and second inductance elements.

5. A wide band high output amplifier according to claim 3, wherein said predetermined driven circuit is a cathode ray tube.

6. A wide band high output amplifier according to claim 4, wherein said predetermined driven circuit is a cathode ray tube.

* * * * *